(12) United States Patent
Maxim et al.

(10) Patent No.: US 10,622,309 B2
(45) Date of Patent: Apr. 14, 2020

(54) TRANSMISSION LINE STRUCTURE WITH HIGH Q FACTOR AND LOW INSERTION LOSS FOR MILLIMETER WAVE APPLICATIONS

(71) Applicant: Qorvo US, Inc., Greensboro, NC (US)

(72) Inventors: George Maxim, Saratoga, CA (US); Dirk Robert Walter Leipold, San Jose, CA (US); Julio C. Costa, Oak Ridge, NC (US); Baker Scott, San Jose, CA (US); Danny W. Chang, San Francisco, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/174,678

(22) Filed: Oct. 30, 2018

(65) Prior Publication Data

US 2019/0131245 A1 May 2, 2019

Related U.S. Application Data

(60) Provisional application No. 62/578,784, filed on Oct. 30, 2017.

(51) Int. Cl.
| | | |
|---|---|---|
| *H01L 23/528* | (2006.01) | |
| *H01L 23/532* | (2006.01) | |
| *H01L 23/29* | (2006.01) | |
| *H01P 1/15* | (2006.01) | |
| *H01L 23/66* | (2006.01) | |
| *H01L 29/06* | (2006.01) | |
| *H01L 23/552* | (2006.01) | |
| *H01L 23/522* | (2006.01) | |

(52) U.S. Cl.
CPC ...... *H01L 23/53266* (2013.01); *H01L 23/293* (2013.01); *H01L 23/5225* (2013.01); *H01L 23/552* (2013.01); *H01L 23/66* (2013.01); *H01L 29/0649* (2013.01); *H01P 1/15* (2013.01)

(58) Field of Classification Search
CPC ... H01L 23/5225; H01L 23/66; H01L 23/552; H01L 23/522; H01L 23/535; H01L 21/76802; H01L 21/823475; H01P 1/15
See application file for complete search history.

(56) References Cited

U.S. PATENT DOCUMENTS

2005/0245063 A1* 11/2005 Chinthakindi ...... H01L 21/7682
438/618

* cited by examiner

*Primary Examiner* — Hsien Ming Lee
(74) *Attorney, Agent, or Firm* — Withrow & Terranova, P.L.L.C.

(57) ABSTRACT

The present disclosure relates to a transmission line structure embedded in a back-end-of-line (BEOL) body that has a cavity. The transmission line structure includes a signal transmission line, a ground plane and a shielding line. The signal transmission line and the first shielding line are formed on a same metallization level, and the ground plane is formed underneath and electrically connected to the first shielding line. A side surface of the signal transmission line and a side surface of the first shielding line, which faces the side surface of the signal transmission line, are exposed to the cavity of the BEOL body, and not covered by any high resistivity conductive coating.

23 Claims, 13 Drawing Sheets

TRANSMISSION LINE STRUCTURE WITH HIGH Q FACTOR AND LOW INSERTION LOSS FOR MILLIMETER WAVE APPLICATIONS

RELATED APPLICATIONS

This application claims the benefit of provisional patent application Ser. No. 62/578,784, filed Oct. 30, 2017, the disclosure of which is hereby incorporated herein by reference in its entirety.

FIELD OF THE DISCLOSURE

The present disclosure relates to a transmission line structure and a process for making the same, and more particularly to a transmission line structure, which has a high quality (Q) factor and low insertion loss, and is embedded in a back-end-of-line (BEOL) region of a semiconductor package, and a process for increasing the Q factor and reducing the insertion loss of the transmission line structure.

BACKGROUND

Traditional on-chip transmission lines may be embedded in a back-end-of-line (BEOL) region of a semiconductor package. As illustrated in FIG. 1, a conventional coplanar transmission line structure 10 is embedded in a BEOL region 12. The coplanar transmission line structure 10 includes a signal transmission line 14, a ground plane 16, shielding lines 18, and vias 20. The signal transmission line 14 and the shielding lines 18 are disposed on a same metallization level and the shielding lines 18 are electrically contiguous with the ground plane 16 through the vias 20. As such, the electric fields are formed horizontally between the signal transmission line 14 and the coplanar shielding lines 18. In addition, a sticking coating 22, which is used for metal deposition, is also formed in the BEOL region 12. The sticking coating 22 covers side walls and a bottom surface of each of the signal transmission line 14, the ground plane 16, and the shielding lines 18. Normally, the sticking coating 22 is formed of Tantalum Nitride (TaN). Furthermore, a top surface of each of the signal transmission line 14, the ground plane 16, and the shielding lines 18 are covered by an antireflective coating 24 to reduce optical reflection of these metals. Normally, the antireflective coating 24 is formed of Titanium Nitride (TiN).

It is clear to those skilled in the art that the TaN and TiN are poorly conductive materials. For low frequency applications, the current through the signal transmission line 14 will spread out the whole metal, such that the sticking coating 22 and the antireflective coating 24 may not obviously affect the quality (Q) factor and the insertion loss of the signal transmission line 14. However, for millimeter wave (mmWave) applications, the current through the signal transmission line 14 will circulate predominantly in these high resistivity coatings 22/24 at edges of the signal transmission line 14, the Q factor of the signal transmission line 14 will be poor, and the insertion loss of the signal transmission line 14 will be increased.

Accordingly, it would be desirable to improve designs of the transmission line structure in the BEOL region of a semiconductor package, so as to increase the Q factor and reduce the insertion loss of the transmission line structure for mmWave applications.

SUMMARY

The present disclosure relates to a transmission line structure, which has a high quality (Q) factor and low insertion loss, and is embedded in a back-end-of-line (BEOL) region of a semiconductor package. The disclosed semiconductor package includes a BEOL body and a transmission line structure embedded in the BEOL body. The BEOL body is formed of a dielectric material and has a first cavity within the BEOL body. The transmission line structure includes a signal transmission line, a ground plane, a first shielding line, an antireflective coating, and a sticking coating. Herein, the signal transmission line and the first shielding line are formed on a same metallization level within the BEOL body, and the ground plane is formed underneath and electrically connected to the first shielding line. The antireflective coating covers at least a portion of a top surface of each of the signal transmission line, the ground plane, and the first shielding line. The sticking coating covers a bottom surface of the signal transmission line, a bottom surface and side surfaces of the ground plane, and at least a portion of a bottom surface and at least a portion of side surfaces of the first shielding line. A first side surface of the signal transmission line and a first side surface of the first shielding line are exposed to the first cavity of the BEOL body and are not covered by either the antireflective coating or the sticking coating. The first side surface of the signal transmission line and the first side surface of the first shielding line face each other.

In one embodiment of the semiconductor package, the antireflective coating is formed of Titanium Nitride (TiN), and the sticking coating is formed of Tantalum Nitride (TaN).

According to another embodiment, the semiconductor package further includes an encapsulation layer. Herein, the encapsulation layer is formed over exposed surfaces within the first cavity, such that the encapsulation layer is in contact with the first side surface of the signal transmission line and the first side surface of the first shielding line. The encapsulation layer is formed of a non-conductive material.

In one embodiment of the semiconductor package, the encapsulation layer extends over a top surface of the BEOL body.

In one embodiment of the semiconductor package, the encapsulation layer is formed of one of glass, plastic, silicones, polyesters, photovoltaic (PV) materials, resins, ethyl vinyl acetate (EVA) materials, and non-EVA materials.

According to another embodiment, the semiconductor package further includes an encapsulation component. Herein, the encapsulation component fills the first cavity, such that the encapsulation component is in contact with the first side surface of the signal transmission line and the first side surface of the first shielding line. The encapsulation component is formed of a non-conductive material.

According to another embodiment, the semiconductor package further includes a sealing layer, which is formed over a top surface of the BEOL body to seal the encapsulation component.

In one embodiment of the semiconductor package, the encapsulation component is formed of polymers, isomers powders, or polymer powders with an additive, and the sealing layer is formed of glass, plastic, silicones, polyesters, PV materials, resins, EVA materials, and non-EVA materials.

According to another embodiment, the semiconductor package further includes a substrate, an insulator layer over the substrate, and a device layer over the insulator layer and underneath the BEOL body. Herein, the device layer includes a shallow trench isolation (STI) region and at least one device region. The transmission line structure is aligned above the STI region and not over the device region.

In one embodiment of the semiconductor package, the transmission line structure further includes an intermediate line. The intermediate line is formed between the ground plane and the first shielding line. The first shielding line, the intermediate line, and the ground plane are electrically connected. The antireflective coating covers at least a portion of a top surface of the intermediate line, and the sticking coating covers at least a portion of a bottom surface and at least a portion of side surfaces of the intermediate line.

In one embodiment of the semiconductor package, a first side surface of the intermediate line is exposed to the first cavity and is not covered by either the antireflective coating or the sticking coating.

In one embodiment of the semiconductor package, the side surfaces of the intermediate line are fully covered by the sticking coating, and not exposed to the first cavity.

In one embodiment of the semiconductor package, the transmission line structure further includes a second shielding line, and the BEOL body further has a second cavity within the BEOL body. The signal transmission line is formed on the same metallization level as the first shielding line and the second shielding line, and surrounded by the first shielding line and the second shielding line. The ground plane is electrically connected to the second shielding line. The antireflective coating covers at least a portion of a top surface of the second shielding line, and the sticking coating covers at least a portion of a bottom surface and at least a portion of side surfaces of the second shielding line. A second side surface of the signal transmission line and a first side surface of the second shielding line are exposed to the second cavity and are not covered by either the antireflective coating or the sticking coating. Herein, the second side surface of the signal transmission line and the first side surface of the second shielding line face each other.

In one embodiment of the semiconductor package, the transmission line structure further include at least one via, which extends through the sticking coating on the bottom surface of the first shielding line and is in contact with the first shielding line, and extends through the antireflective coating on the top surface of the ground plane and is in contact with the ground plane, such that the ground plane is electrically connected to the first shielding line.

In one embodiment of the semiconductor package, the transmission line, the first shielding line, and the ground plane are formed of copper or aluminum.

In one embodiment of the semiconductor package, at least a portion of the top surface of the ground plane is not covered by the antireflective coating and exposed to the first cavity at the bottom of the first cavity.

In one embodiment of the semiconductor package, the first cavity does not extend to the ground plane, and no portion of the ground plane is exposed to the first cavity.

In one embodiment of the semiconductor package, the first cavity includes an upper cavity portion and a lower cavity portion. Herein, the upper cavity portion is above the top surface of the transmission line, and the lower cavity portion is below the top surface of the transmission line. The upper cavity portion has a width that is wider than a distance between the first side surface of the signal transmission line and the first side surface of the first shielding line. The lower cavity portion has a width that is essentially the same as the distance between the first side surface of the signal transmission line and the first side surface of the first shielding line.

According to an exemplary process a precursor BEOL region is provided. The precursor BEOL region includes a BEOL body and a transmission line structure. The transmission line structure is embedded in the BEOL body and includes a signal transmission line, a ground plane, a first shielding line, an antireflective coating, and a sticking coating. The signal transmission line and the first shielding line are formed on a same metallization level within the BEOL body, and the ground plane is formed underneath and electrically connected to the first shielding line. The antireflective coating covers a top surface of the signal transmission line, a top surface of the first shielding line, and at least a portion of a top surface of the ground plane. The sticking coating covers a bottom surface and side surfaces of the signal transmission line, a bottom surface and side surfaces of the ground plane, and side surfaces and at least a portion of a bottom surface of the first shielding line. Next, a portion of the precursor BEOL region is removed to provide a first cavity within the BEOL body. Herein, a portion of the BEOL body between the signal transmission line and the first shielding line is removed. The sticking coating over a first side surface of the signal transmission line and the sticking coating over a first side surface of the first shielding line are removed. As such, the first side surface of the signal transmission line and the first side surface of the first shielding line are exposed to the first cavity. The first side surface of the signal transmission line and the first side surface of the first shielding line face each other.

According to another embodiment, the exemplary process further includes applying an encapsulation layer over exposed surfaces within the first cavity, such that the encapsulation layer is in contact with the first side surface of the signal transmission line and the first side surface of the first shielding line. Herein, the encapsulation layer is formed of a non-conductive material.

According to another embodiment, the exemplary process further includes applying an encapsulation component to fill the first cavity, such that the encapsulation component is in contact with the first side surface of the signal transmission line and the first side surface of the first shielding line, and applying a sealing layer over a top surface of the BEOL body to seal the encapsulation component. Herein, the encapsulation component is formed of a non-conductive material.

In one embodiment of the exemplary process, removing the portion of the precursor BEOL region is provided by a timed etching process.

In one embodiment of the exemplary process, removing the portion of the precursor BEOL region is provided by a directional etching process.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 provides a conventional transmission line structure.

Figure 1:
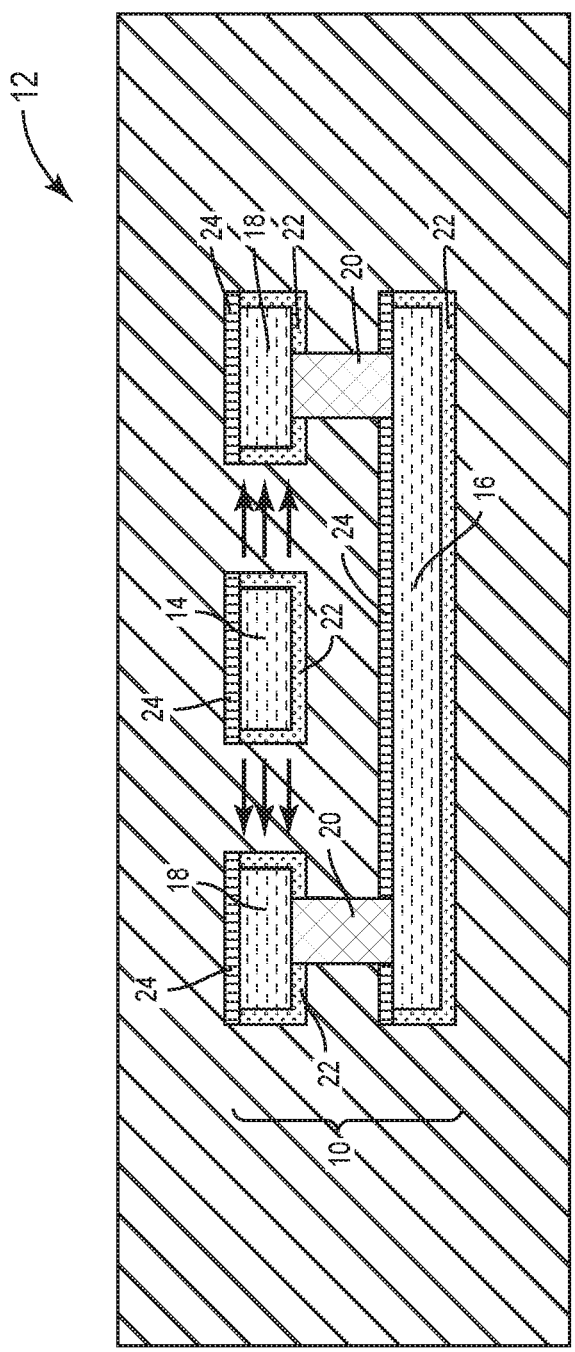
Figure 2:
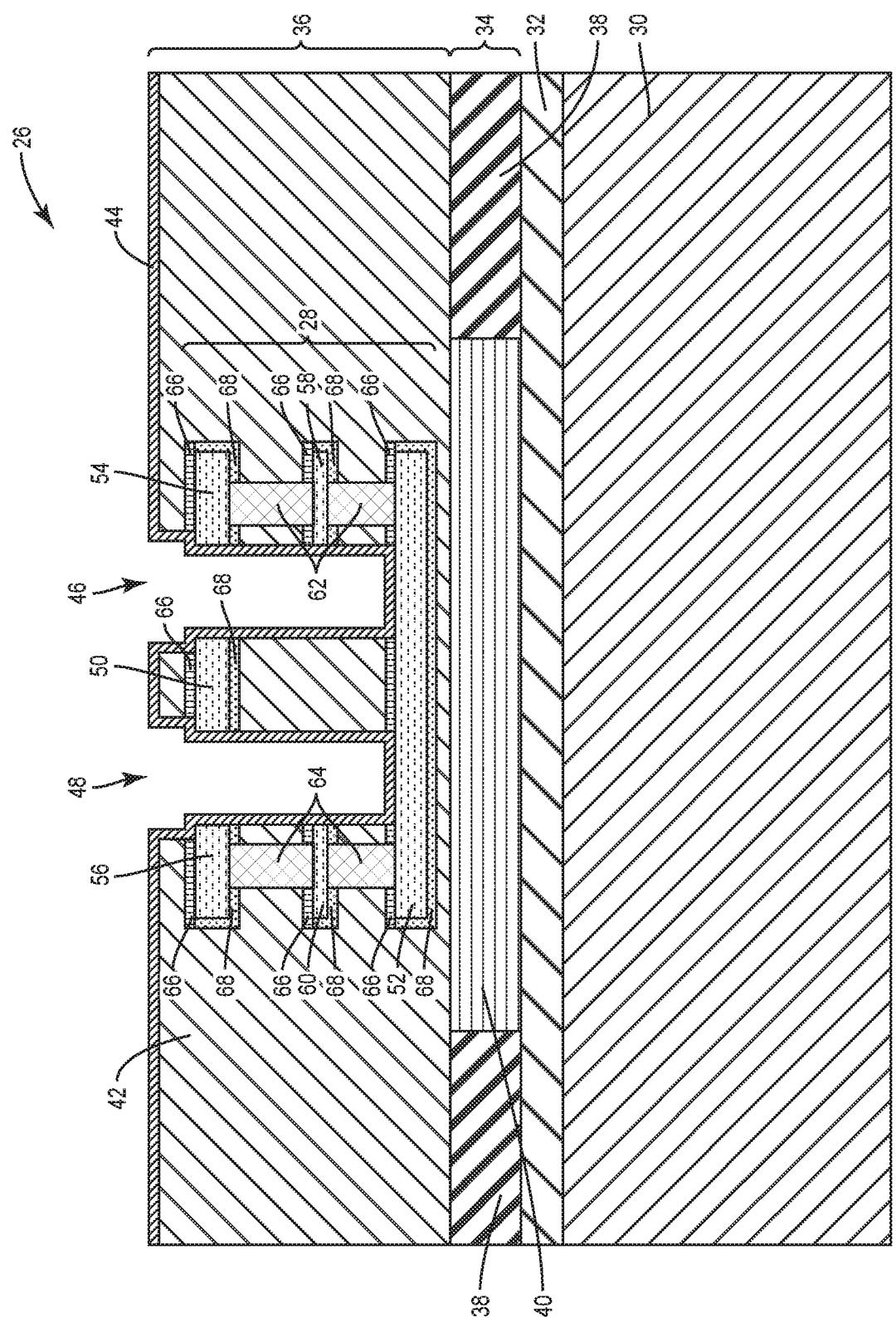
FIG. 2 shows a semiconductor package including an exemplary transmission line structure according to one embodiment of the present disclosure.
Figure 7:
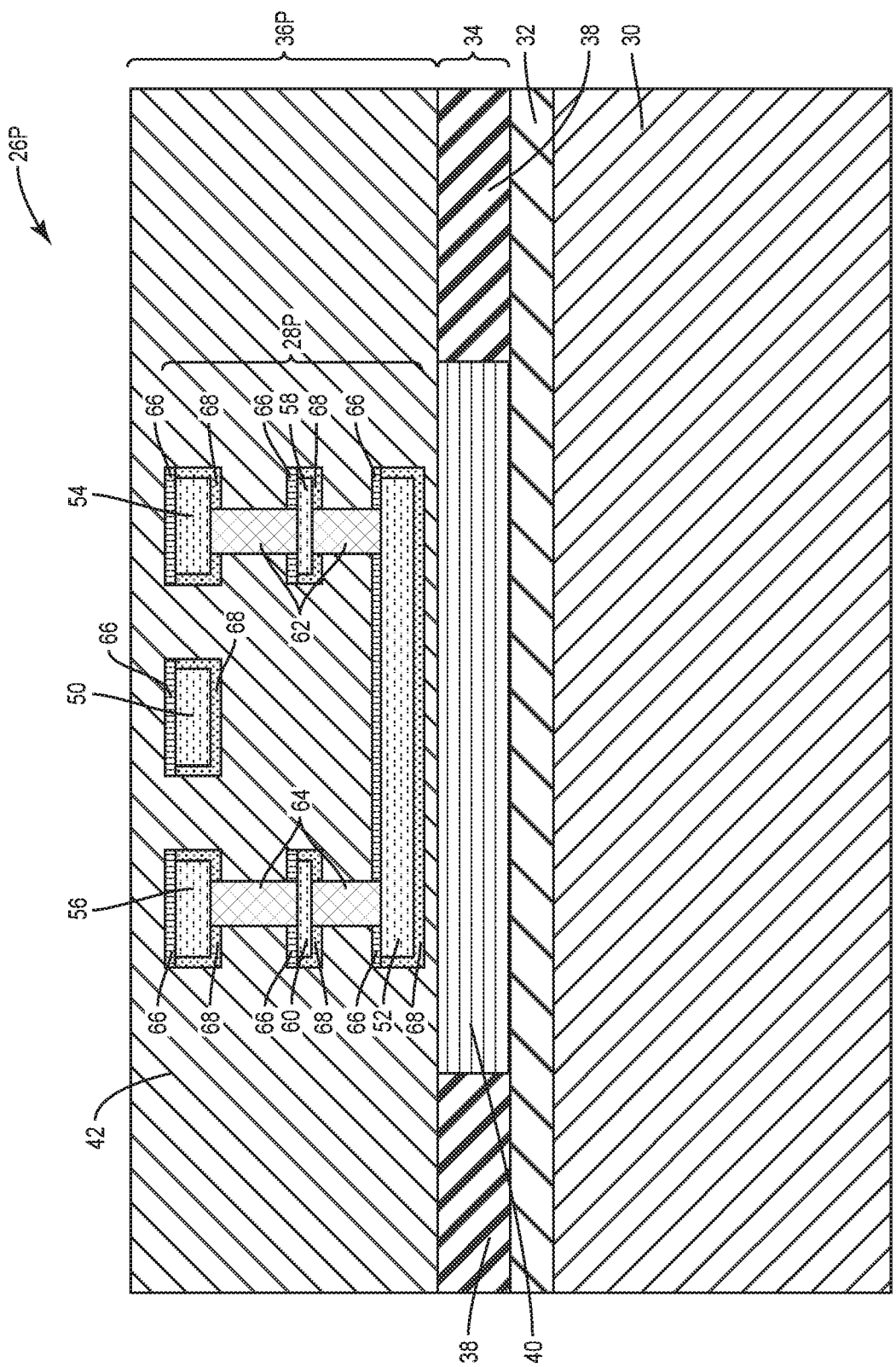
Figure 8A:
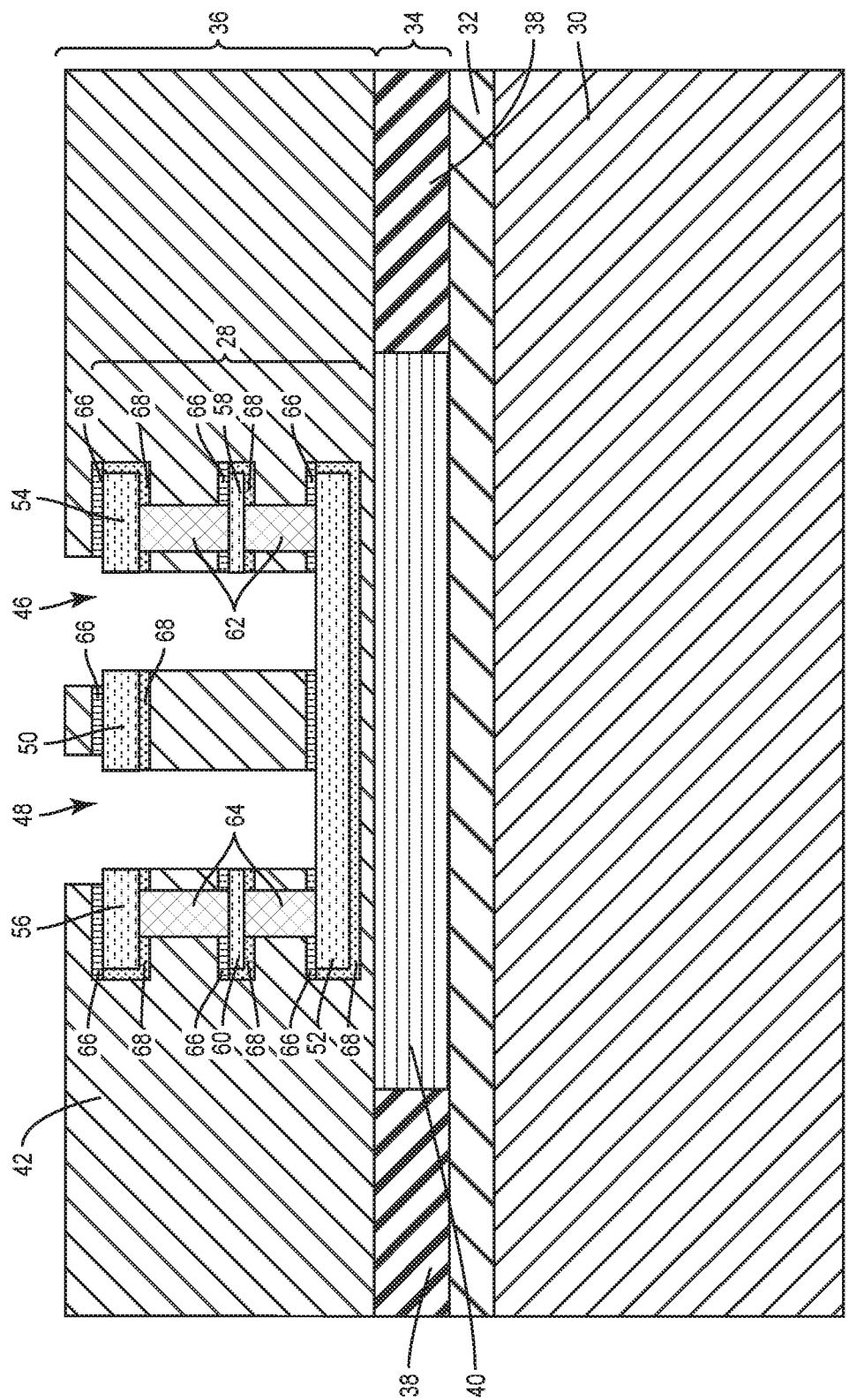
Figure 8B:
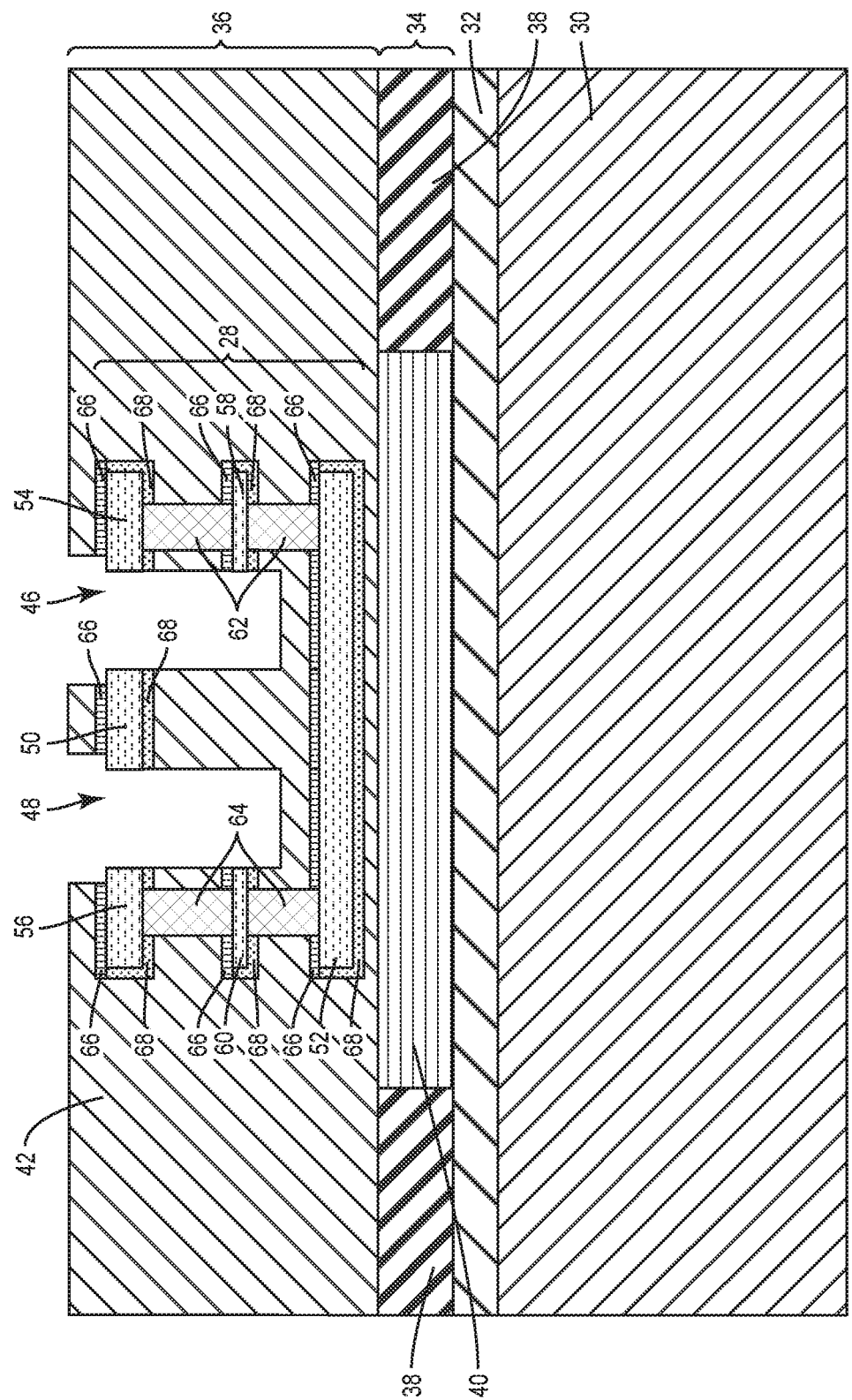
Figure 8C:
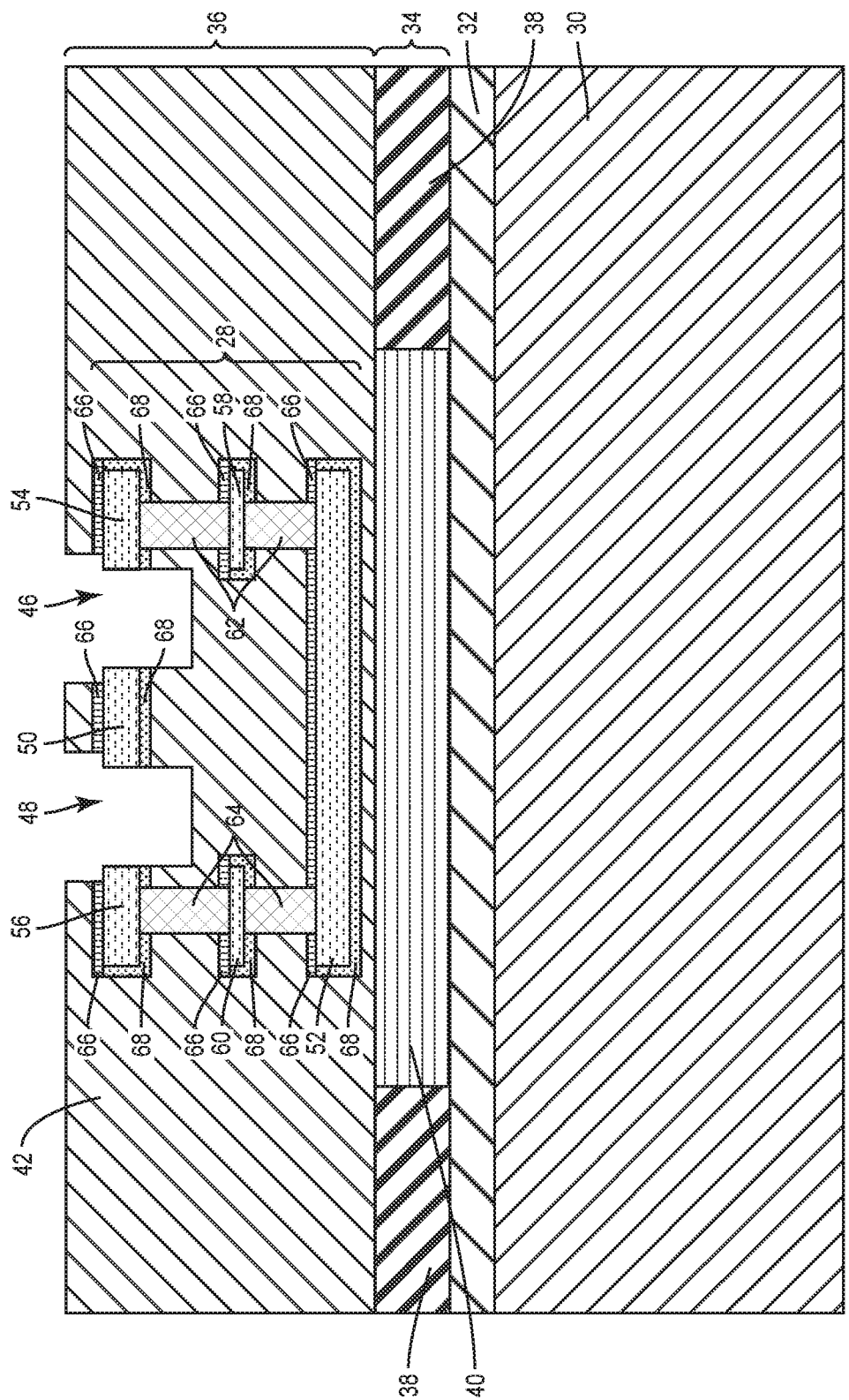
Figure 9:
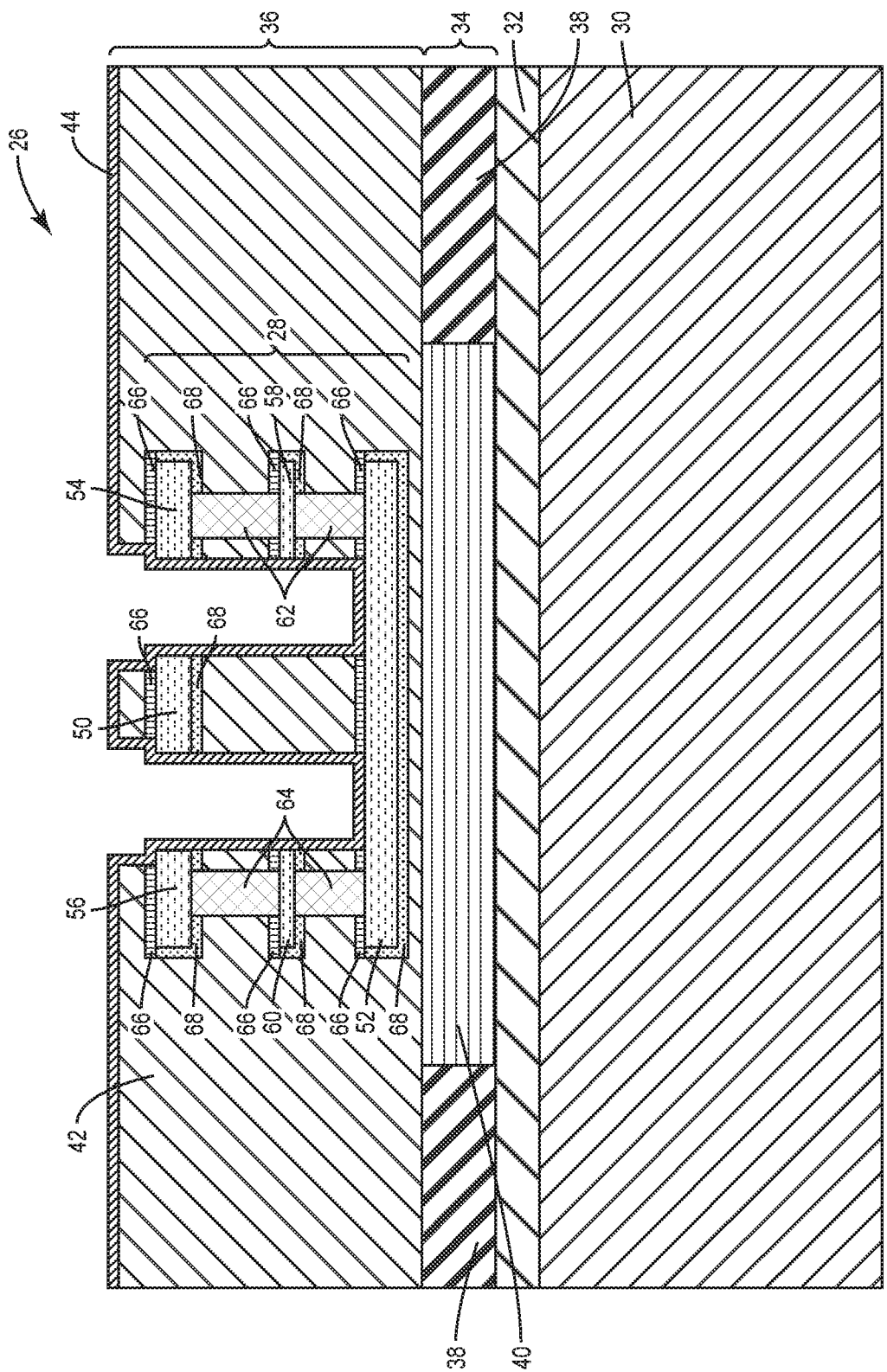

FIGS. 7-9 provide exemplary steps that illustrate a process to fabricate the semiconductor package shown in FIG. 2.

Figure 6:
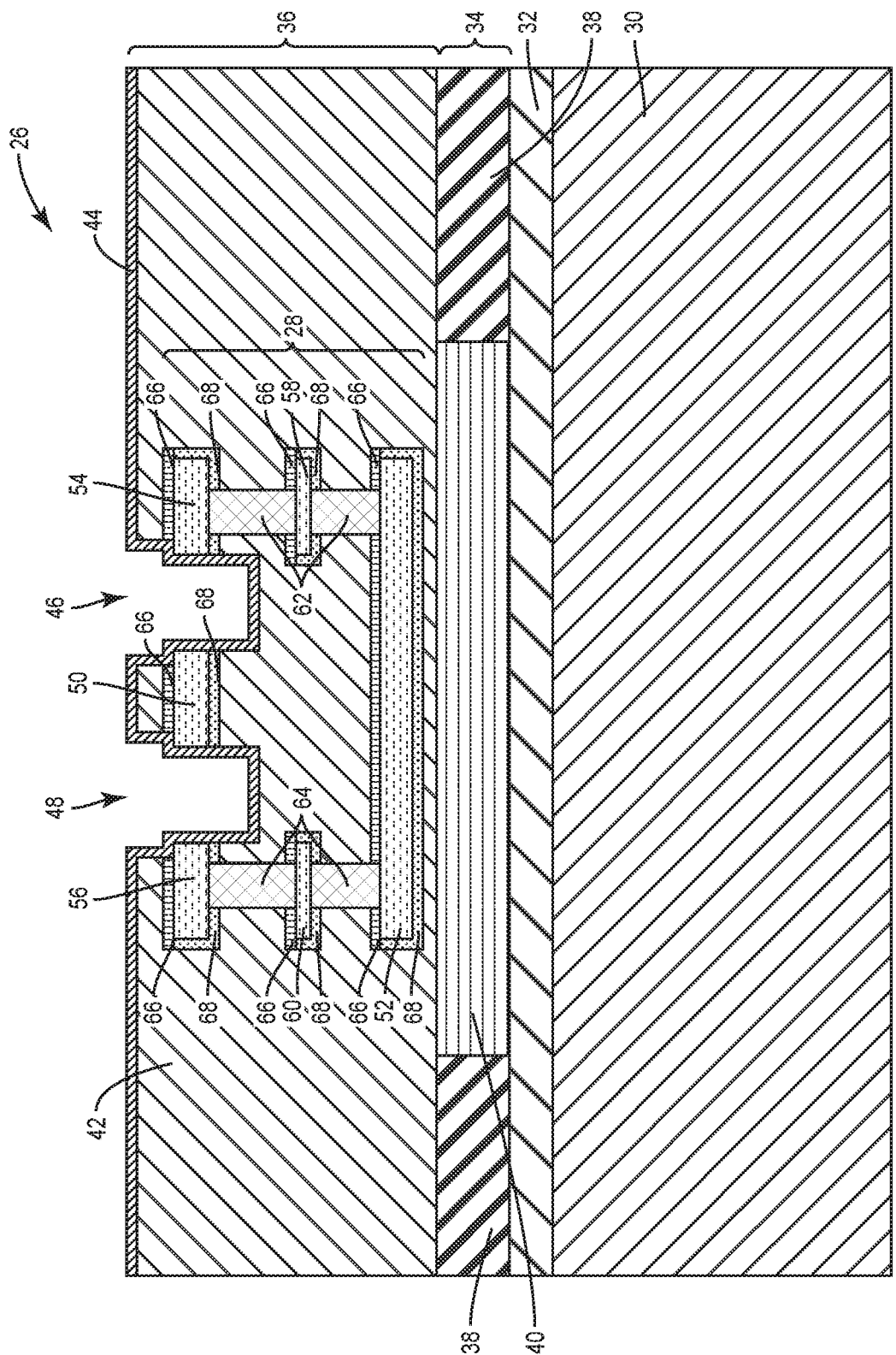
Figure 10A:
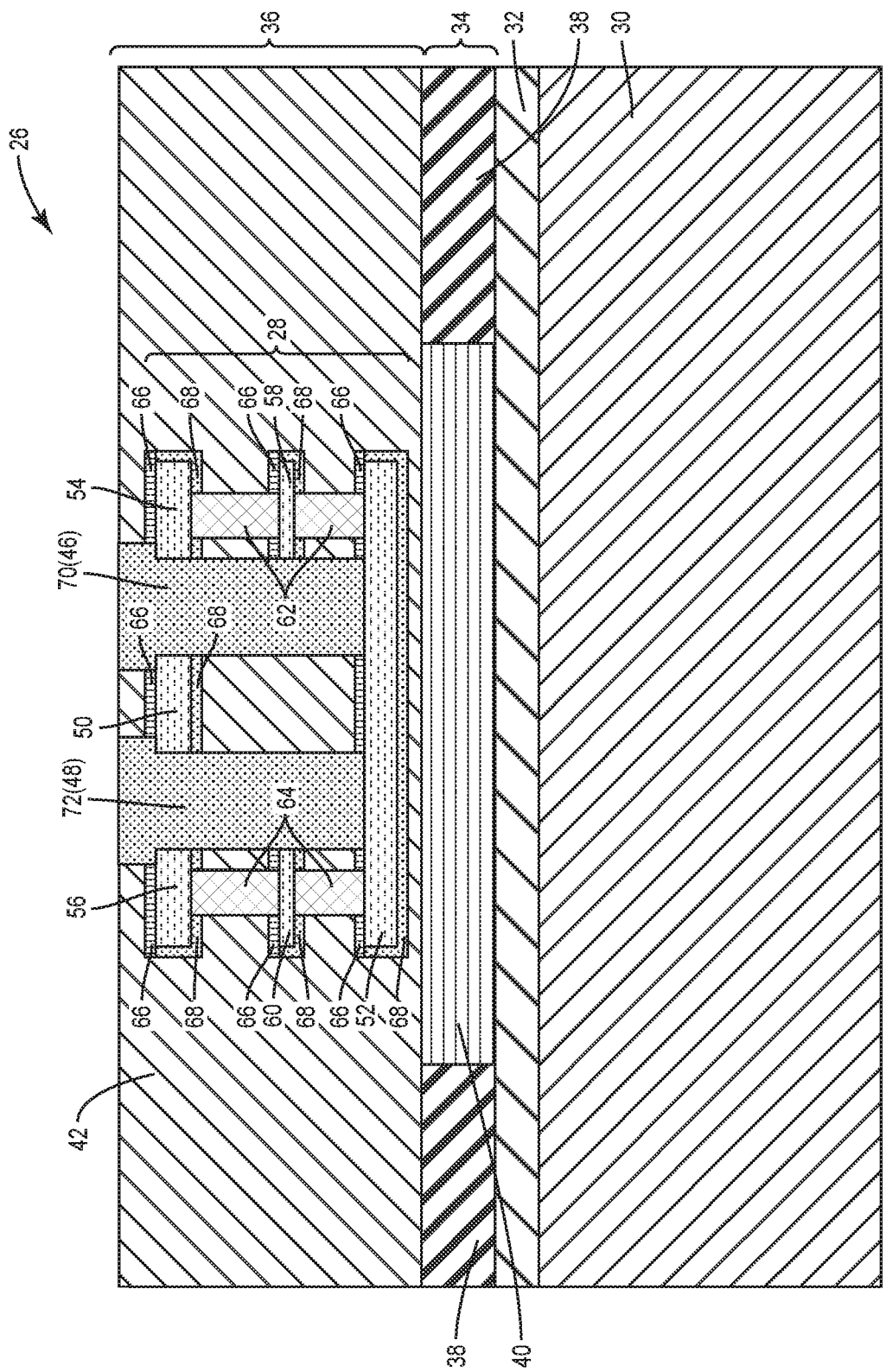
Figure 10B:
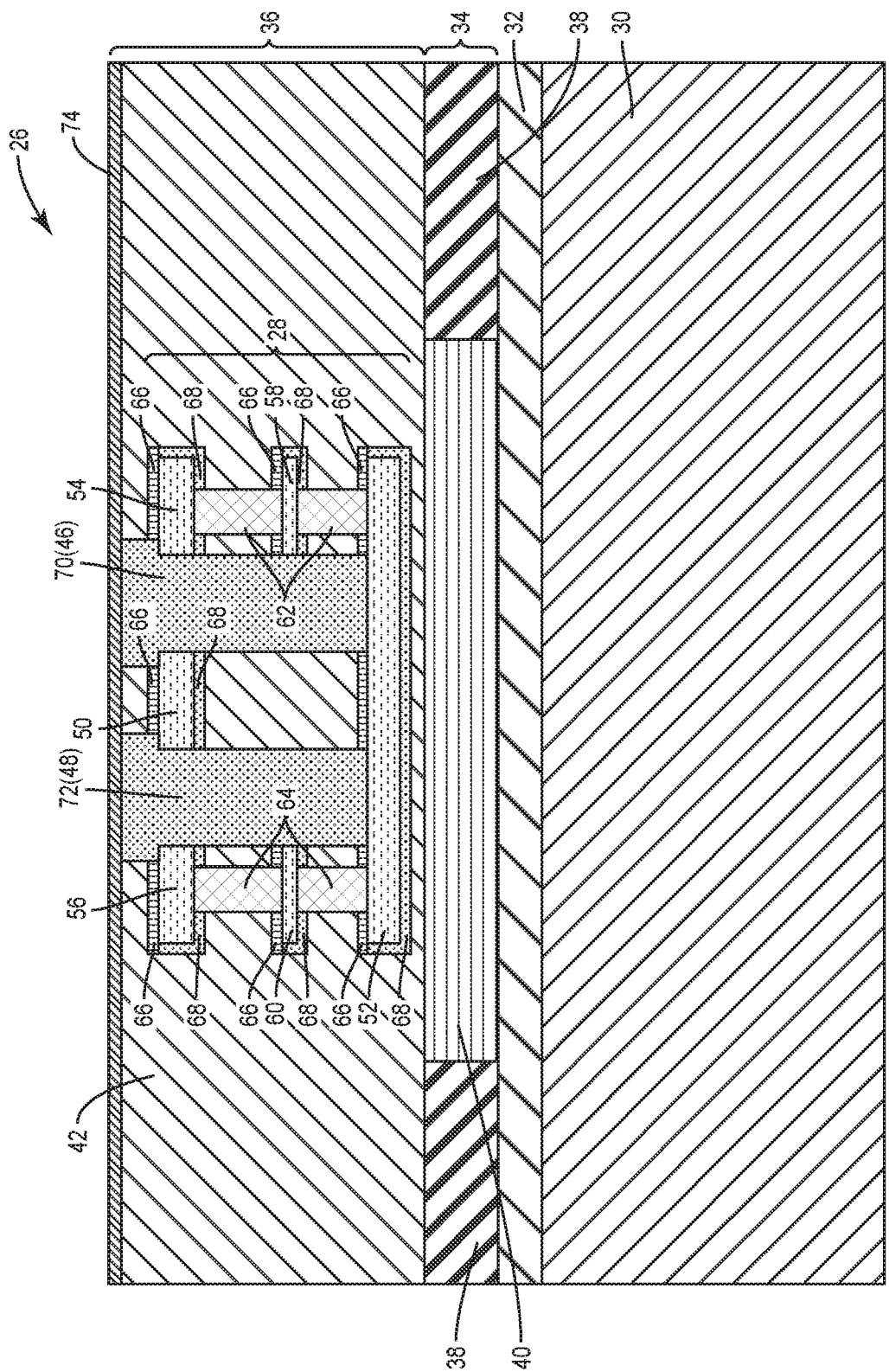

FIGS. 10A-10B provide exemplary steps that illustrate a process to fabricate the semiconductor package shown in FIG. 6.

It will be understood that for clear illustrations, FIGS. 1-9B may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a transmission line structure, which has a high quality (Q) factor and low insertion loss, and is embedded in a back-end-of-line (BEOL) region of a semiconductor package, and a process for making the same. FIG. 2 shows a semiconductor package 26 with an exemplary transmission line structure 28 according to one embodiment of the present disclosure. The semiconductor package 26 includes a substrate 30, an insulator layer 32 over the substrate 30, a device layer 34 over the insulator layer 32, and a BEOL region 36 over the device layer 34.

In detail, the module substrate 30 may be formed from a laminate, a wafer level fan out (WLFO) carrier, a lead frame, a ceramic carrier, or the like. The insulator layer 32 may be a buried oxide (BOX) layer. The device layer 34 may include device regions 38 and at least one isolation region 40 separating the device regions 38 one from another. Each device region 38 may include one or more active devices (not shown), and the isolation region 40 may be formed by shallow trench isolation (STI). For the purpose of this illustration, the BEOL region 36 includes a BEOL body 42, the transmission line structure 28, and an encapsulation layer 44. The transmission line structure 28 is embedded in the BEOL body 42 and aligned above the isolation region 40 of the device layer 34 (not over the device regions 38). In different applications, the BEOL region 36 may include multiple transmission line structures.

Herein, the BEOL body 42 may be formed of a dielectric material, such as silicon-dioxide, with metal lines, such as copper, aluminum or other metals (not shown). A first cavity 46 and a second cavity 48 are formed within the BEOL body 42. The transmission line structure 28 includes a signal transmission line 50, a ground plane 52, a first shielding line 54, a second shielding line 56, a first intermediate line 58, a second intermediate line 60, first vias 62, second vias 64, an antireflective coating 66, and a sticking coating 68. The signal transmission line 50, the first shielding line 54, and the second shielding line 56 are formed on a same metallization level within the BEOL body 42. The ground plane 52 is formed underneath the signal transmission line 50, the first shielding line 54, and the second shielding line 56. The first intermediate line 58 and a second intermediate line 60 are formed on a same metallization level. The first intermediate line 58 is vertically between the first shielding line 54 and the ground plane 52, and the second intermediate line 60 is vertically between the second shielding line 56 and the ground plane 52. The signal transmission line 50, the ground plane 52, the first shielding line 54, the second shielding line 56, the first intermediate line 58, and the second intermediate line 60 may be formed of copper, aluminum, or other suitable metals. The first vias 62 are configured to electrically connect the first shielding line 54, the first intermediate line 58, and the ground plane 52; while the second vias 64 are configured to electrically connect the second shielding line 56, the second intermediate line 60, and the ground plane 52.

The antireflective coating 66 covers at least a portion of a top surface of each of the signal transmission line 50, the ground plane 52, the first shielding line 54, the second shielding line 56, the first intermediate line 58, and the second intermediate line 60. The sticking coating 68 covers a bottom surface of the signal transmission line 50, a bottom surface and side surfaces of the ground plane 52, at least a portion of a bottom surface and at least a portion of side surfaces of each of the first shielding line 54, the second shielding line 56, the first intermediate line 58, and the second intermediate line 60. Herein, the antireflective coating 66 may be formed of Titanium Nitride (TiN), and the sticking coating 68 may be formed of Tantalum Nitride (TaN).

In this embodiment, one of the first vias 62 extends vertically through the sticking coating 68 on the bottom surface of the first shielding line 54 and vertically through the antireflective coating 66 on the top surface of the first intermediate line 58, and is in contact with the first shielding line 54 and the first intermediate line 58. Another first via 62 extends vertically through the sticking coating 68 on the bottom surface of the first intermediate line 58 and vertically through the antireflective coating 66 on the top surface of the ground plane 52, and is in contact with the first intermediate line 58 and the ground plane 52. Similarly, one of the second vias 64 extends vertically through the sticking coating 68 on the bottom surface of the second shielding line 56 and vertically through the antireflective coating 66 on the top surface of the second intermediate line 60, and is in contact with the second shielding line 56 and the second intermediate line 60. Another second via 64 extends vertically through the sticking coating 68 on the bottom surface of the second intermediate line 60 and vertically through the antireflective coating 66 on the top surface of the ground plane 52, and is in contact with the second intermediate line 60 and the ground plane 52.

The first cavity 46 extends from a top surface of the BEOL body 42, between the signal transmission line 50 and the first shielding line 54, and towards the ground plane 52. In this embodiment, a first side surface of the signal transmission line 50, a first side surface of the first shielding line 54, a first side surface of the first intermediate line 58, and a first portion of the top surface of the ground plane 52 are exposed to the first cavity 46, and are not covered by either the antireflective coating 66 or the sticking coating 68. The first side surface of the signal transmission line 50 and the first side surface of the first shielding line 54 face each other. The first side surface of the first shielding line 54 and the first side surface of the first intermediate line 58 face a same direction. Herein, the first cavity 46 includes an upper cavity portion above the top surface of the transmission line 50 and a lower cavity portion is below the top surface of the transmission line 50. The upper cavity portion of the first cavity 46 may have a width that is no narrower than (wider than or essentially the same as) a distance between the first side surface of the signal transmission line 50 and the first side surface of the first shielding line 54. The lower cavity portion of the first cavity 46 has a width that is essentially the same as the distance between the first side surface of the signal transmission line 50 and the first side surface of the first shielding line 54.

The second cavity 48 extends from the top surface of the BEOL body 42, between the signal transmission line 50 and the second shielding line 56, and towards the ground plane 52. In this embodiment, a second side surface of the signal transmission line 50, a first side surface of the second shielding line 56, a first side surface of the second intermediate line 60, and a second portion of the top surface of the ground plane 52 are exposed to the second cavity 48, and are not covered by either the antireflective coating 66 or the sticking coating 68. The second side surface of the signal transmission line 50 and the first side surface of the second shielding line 56 face each other. The first side surface of the second shielding line 56 and the first side surface of the second intermediate line 60 face a same direction. Herein, the second cavity 48 includes an upper cavity portion above the top surface of the transmission line 50 and a lower cavity portion is below the top surface of the transmission line 50. The upper cavity portion of the second cavity 48 may have a width that is no narrower than (wider than or essentially the same as) a distance between the second side surface of the signal transmission line 50 and the first side surface of the second shielding line 56. The lower cavity portion of the second cavity 48 has a width that is essentially the same as the distance between the second side surface of the signal transmission line 50 and the first side surface of the second shielding line 56.

The encapsulation layer 44 is formed over exposed surfaces within the first cavity 46 and the second cavity 48. As such, the encapsulation layer 44 is in contact with the first side surface of the signal transmission line 50, the first side surface of the first shielding line 54, the first side surface of the first intermediate line 58, and the first portion of the top surface of the ground plane 52 within the first cavity 46. In addition, the encapsulation layer 44 is in contact with the second side surface of the signal transmission line 50, the first side surface of the second shielding line 56, the first side surface of the second intermediate line 60, and the second portion of the top surface of the ground plane 52 within the second cavity 48. Further, the encapsulation layer 44 may extend over the top surface of the BEOL body 42. The encapsulation layer 44 may be formed of a non-conductive material, such as glass, plastic, silicones, polyesters, photovoltaic (PV) materials, resins, ethyl vinyl acetate (EVA) materials, non-EVA materials, or other materials resistant to external contaminants.

Figure 3:
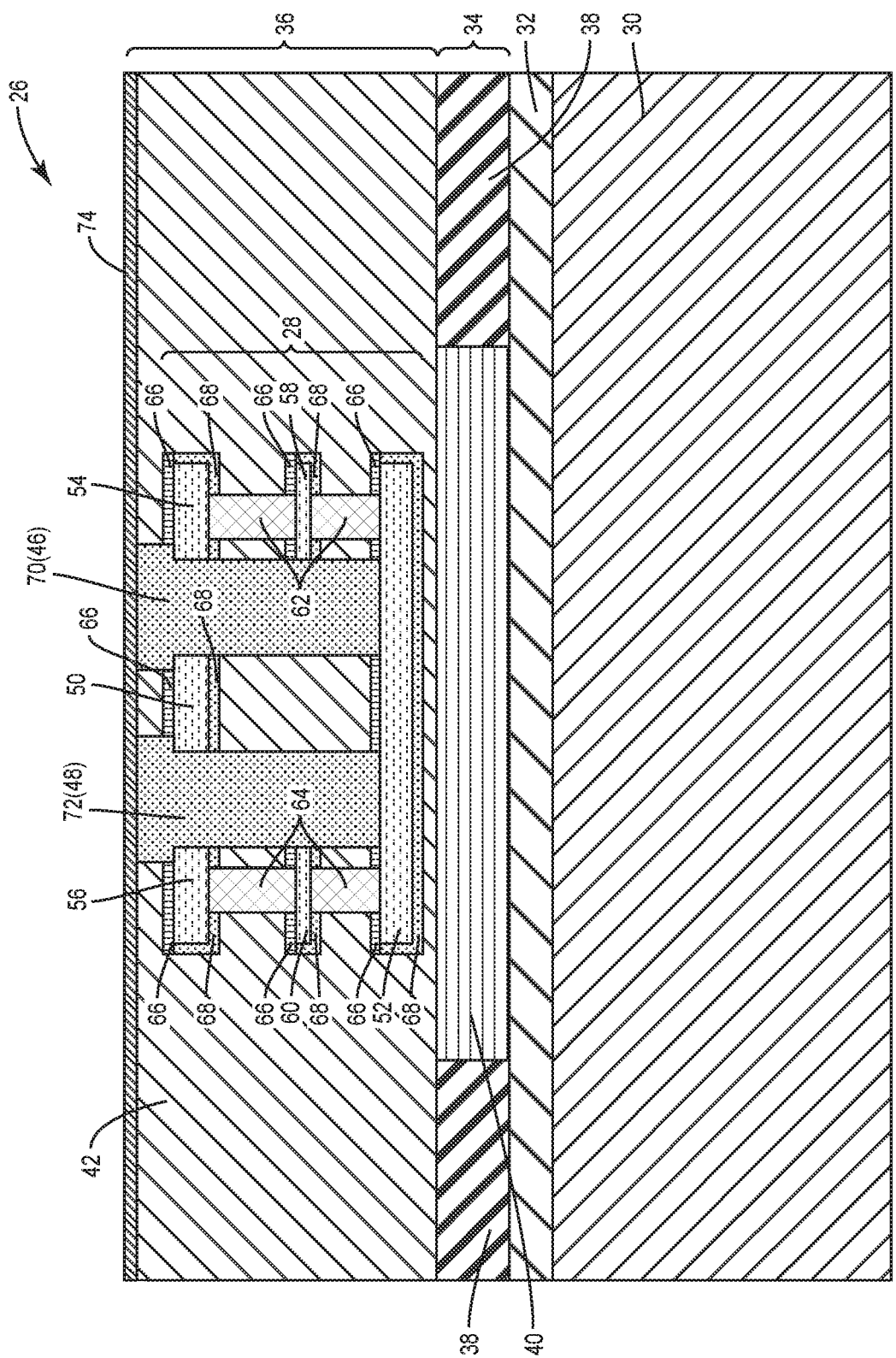
FIGS. 3-6 show a semiconductor package including an alternative transmission line structure according to one embodiment of the present disclosure.

In some applications, the BEOL region 36 does not include the encapsulation layer 44 to cover the exposed surfaces within the first cavity 46 and the second cavity 48. Instead, the BEOL region 36 may include a first encapsulation component 70 and a second encapsulation component 72 to fill the first cavity 46 and the second cavity 48, respectively, as illustrated in FIG. 3. Herein, the first encapsulation component 70 is in contact with the first side surface of the signal transmission line 50, the first side surface of the first shielding line 54, the first side surface of the first intermediate line 58, and the first portion of the top surface of the ground plane 52 within the first cavity 46. The second encapsulation component 72 is in contact with the second side surface of the signal transmission line 50, the first side surface of the second shielding line 56, the first side surface of the second intermediate line 60, and the second portion of the top surface of the ground plane 52 within the second cavity 48. The first encapsulation component 70 and the second encapsulation component 72 may be formed of a non-conductive material, such as polymers, polymer powder compressed, polymer powder non-compressed, isomers powders, or polymer powders with an additive that enhances a specific characteristic (e.g. magnetic permeability may be increased by using a ferro-magnetic powder as the additive). In addition, there may a sealing layer 74 formed over the top surface of the BEOL body 42 to seal the first and second encapsulation components 70 and 72. The sealing layer 74 may be formed of glass, plastic, silicones, polyesters, PV materials, resins, EVA materials, and non-EVA materials.

Figure 4:
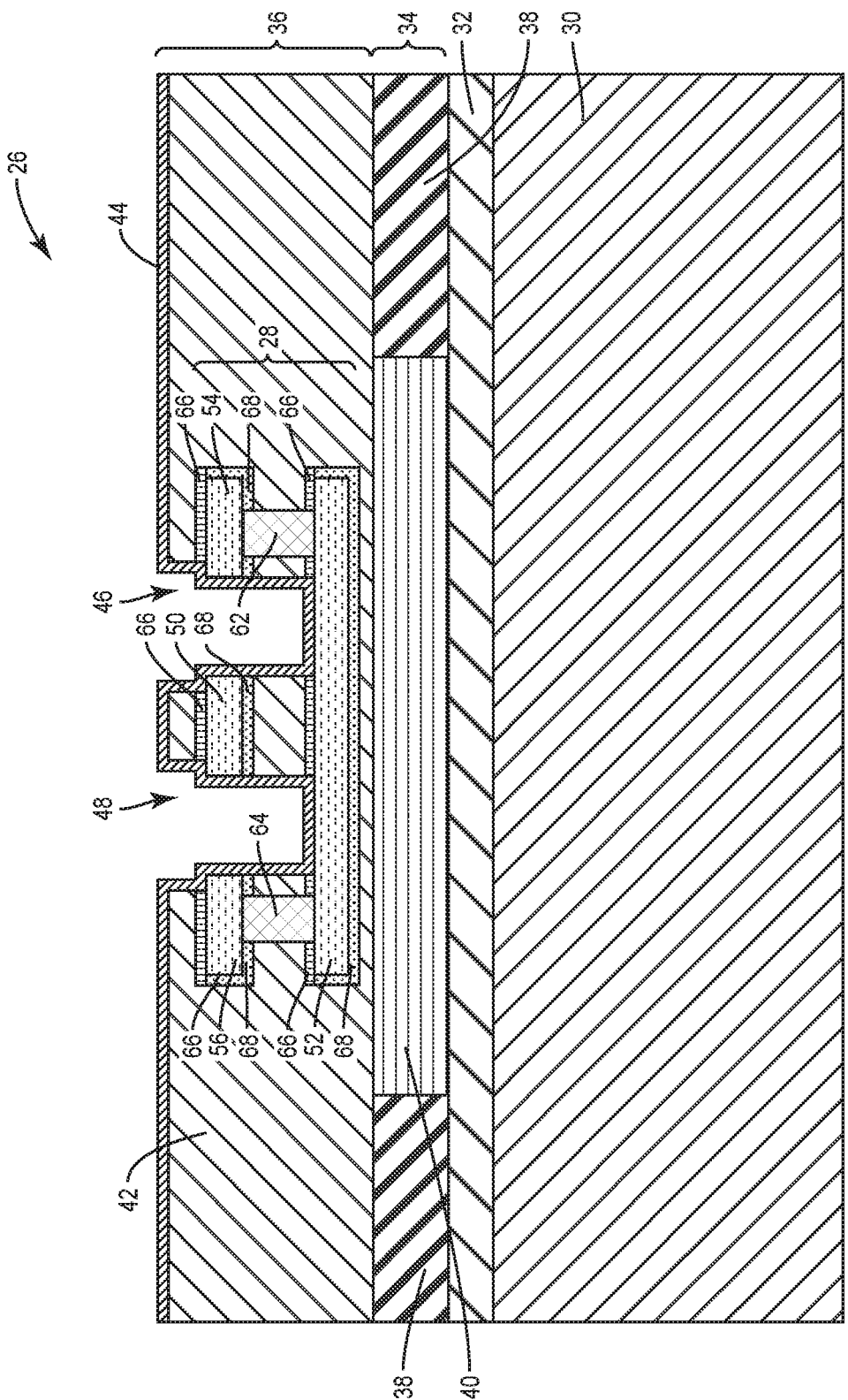

In some applications, the transmission line structure 28 does not include the first intermediate line 58 and the second intermediate line 60, as illustrated in FIG. 4. The first via 62 extends vertically through the sticking coating 68 on the bottom surface of the first shielding line 54 and vertically through the antireflective coating 66 on the top surface of the ground plane 52, and is in contact with the first shielding line 54 and the ground plane 52. The second via 64 extends vertically through the sticking coating 68 on the bottom surface of the second shielding line 56 and vertically through the antireflective coating 66 on the top surface of the ground plane 52, and is in contact with the second shielding line 56 and the ground plane 52. In this embodiment, the first side surface of the signal transmission line 50, the first side surface of the first shielding line 54, and the first portion of the top surface of the ground plane 52 are exposed to the first cavity 46, and are not covered by either the antireflective coating 66 or the sticking coating 68. Consequently, the encapsulation layer 44 is in contact with the first side surface of the signal transmission line 50, the first side surface of the first shielding line 54, and the first portion of the top surface of the ground plane 52 within the first cavity 46. The encapsulation layer 44 is also in contact with the second side surface of the signal transmission line 50, the first side surface of the second shielding line 56, and the second portion of the top surface of the ground plane 52 within the second cavity 48.

Figure 5:
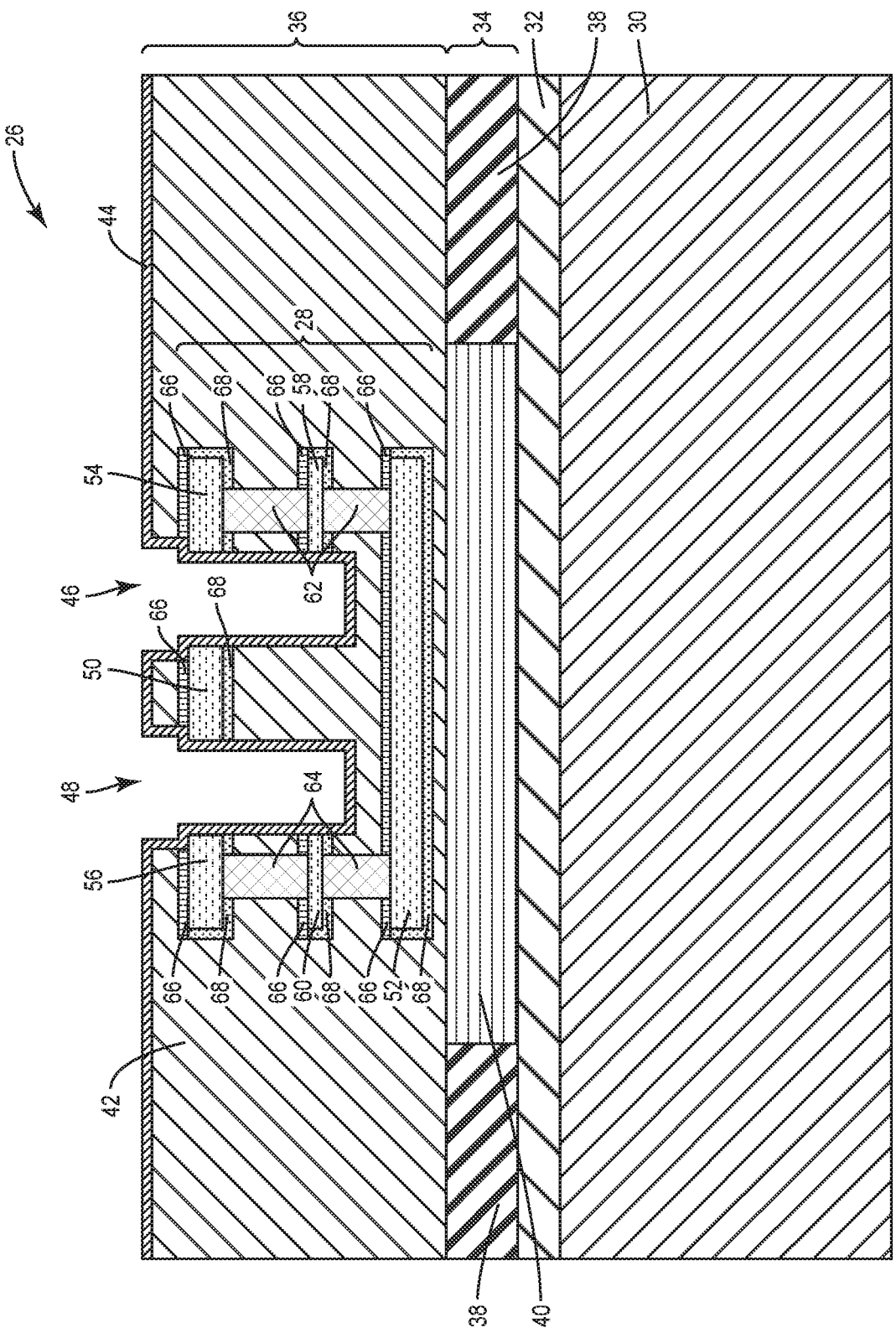

As shown in FIGS. 2-4, both the first cavity 46 and the second cavity 48 extend from the top surface of the BEOL body 42, to the top surface of the ground plane 52. In some applications, the first cavity 46 and/or the second cavity 48 may not reach the ground plane 52. As illustrated in FIG. 5, the first cavity 46 extends from the top surface of the BEOL body 42, extends beyond the first intermediate line 58, and stops above the ground plane 52. As such, only the first side surface of the signal transmission line 50, the first side surface of the first shielding line 54, and the first side surface of the first intermediate line 58 are exposed to the first cavity 46. The second cavity 48 extends from the top surface of the BEOL body 42, extends beyond the second intermediate line 60, and stops above the ground plane 52. As such, only the second side surface of the signal transmission line 50, the first side surface of the second shielding line 56, and the first side surface of the second intermediate line 60 are exposed to the second cavity 48. The encapsulation layer 44 is in contact with the first side surface of the signal transmission line 50, the first side surface of the first shielding line 54, and the first side surface of the first intermediate line 58 within the first cavity 46; and is in contact with the second side surface of the signal transmission line 50, the first side surface of the second shielding line 56, and the first side surface of the second intermediate line 60 within the second cavity 48. Herein, no portion of the ground plane 52 is exposed to the first cavity 46 or the second cavity 48, and the encapsulation layer 44 is not contact with any portion of the ground plane 52.

In another embodiment, as illustrated in FIG. 6, the first cavity 46 extends from the top surface of the BEOL body 42, extends beyond the signal transmission line 50, and stops above the first intermediate line 58. As such, only the first side surface of the signal transmission line 50 and the first side surface of the first shielding line 54 are exposed to the first cavity 46. The second cavity 48 extends from the top surface of the BEOL body 42, extends beyond the signal transmission line 50, and stops above the second intermediate line 60. As such, only the second side surface of the signal transmission line 50 and the first side surface of the second shielding line 56 are exposed to the second cavity 48. The encapsulation layer 44 is in contact with the first side surface of the signal transmission line 50 and the first side surface of the first shielding line 54 within the first cavity 46; and is in contact with the second side surface of the signal transmission line 50 and the first side surface of the second shielding line 56 within the second cavity 48. No side surface of the first intermediate line 58 is exposed to the first cavity 46. The side surfaces of the first intermediate line 58 are fully covered by the sticking coating 68 and not exposed to the first cavity 46. No side surface of the second intermediate line 60 is exposed to the second cavity 48. The side surfaces of the second intermediate line 60 are fully covered by the sticking coating 68 and not exposed to the second cavity 48. In addition, no portion of the ground plane 52 is exposed to the first cavity 46 or the second cavity 48. The encapsulation layer 44 is not contact with the first intermediate line 58, the second intermediate line 60, or the ground plane 52.

Notice that, the first side surface of the signal transmission line 50 and the first side surface of the first shielding line 54 are always exposed to the first cavity 46, and not covered by either the antireflective coating 66 or the sticking coating 68. Typically, the antireflective coating 66 and the sticking coating 68 are formed of conductive materials, such as TiN and TaN, respectively. However, the conductivity of the antireflective coating 66 and the sticking coating 68 are relatively poor. It is clear to those skilled in the art that for millimeter wave (mmWave) applications, current through the signal transmission line 50, current through the first shielding line 54, and current through the second shielding line 56 will circulate predominantly at the edges of the signal transmission line 50, the first shielding line 54, and the second shielding line 56, respectively. If the antireflective coating 66 or the sticking coating 68 covers the first side surface of the signal transmission line 50 and the first side surface of the first shielding line 54 (facing the first side surface of the signal transmission line 50), the current will circulate predominantly in these high resistivity conductive coatings 66/68. Even though the electric fields may be formed horizontally between the signal transmission line 50 and the first shielding line 54, the Q factor of the signal transmission line 50 will be poor and the insertion loss of the signal transmission line 50 will be significant. Similarly, if the antireflective coating 66 or the sticking coating 68 covers the second side surface of the signal transmission line 50 and the first side surface of the second shielding line 56 (facing the second side surface of the signal transmission line 50), the current will circulate predominantly in these high resistivity conductive coatings 66/68. Even though the electric fields may be formed horizontally between the signal transmission line 50 and the second shielding line 56, the Q factor of the signal transmission line 50 will be poor and the insertion loss of the signal transmission line 50 will be significant.

Furthermore, the encapsulation layer 44 covering the first side surface of the signal transmission line 50 and the first side surface of the first shielding line 54 (the encapsulation layer 44 covering the second side surface of the signal transmission line 50 and the first side surface of the second shielding line 56) will not significantly affect the Q factor and the insertion loss performance of the signal transmission line 50. It is because the encapsulation layer 44 is formed of a non-conductive material. The current will not circulate at the encapsulation layer 44. In summary, if the first side surface of the signal transmission line 50 and the first side surface of the first shielding line 54 are not covered by high resistivity conductive coatings, regardless if they are covered by a non-conductive material, the Q factor and the insertion loss performance of the signal transmission line 50 will improve. Similarly, if the second side surface of the signal transmission line 50 and the first side surface of the second shielding line 56 are not covered by high resistivity conductive coatings, regardless if they are covered by a non-conductive material, the Q factor and the insertion loss performance of the signal transmission line 50 will also improve.

FIGS. 7-9 provide exemplary steps that illustrate a process to fabricate the exemplary semiconductor package 26 shown in FIG. 2. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 7-9.

Initially, a precursor package 26P with a precursor BEOL region 36P is provided as depicted in FIG. 7. Besides the precursor BEOL region 36P, the precursor package 26P also includes the substrate 30, the insulator layer 32 over the substrate 30, and the device layer 34 over the insulator layer 32 and below the precursor BEOL region 36P. For the purpose of this illustration, the precursor BEOL region 36P includes the BEOL body 42 and a precursor transmission line structure 28P. The precursor transmission line structure 28P is embedded in the BEOL body 42 and aligned above the isolation region 40 of the device layer 34 (not over the device regions 38). In different applications, the precursor BEOL region 36P may include multiple precursor transmission line structures.

The precursor transmission line structure 28P includes the signal transmission line 50, the ground plane 52, the first shielding line 54, the second shielding line 56, the first intermediate line 58, the second intermediate line 60, the first vias 62, the second vias 64, the antireflective coating 66, and the sticking coating 68. Herein, the antireflective coating 66 covers the top surface of each of the signal transmission line 50, the first shielding line 54, and the second shielding line 56; and covers at least a portion of the top surface of each of the ground plane 52, the first intermediate line 58, and the second intermediate line 60. The sticking coating 68 covers the bottom surface and side surfaces of the signal transmission line 50, the bottom surface and side surfaces of the ground plane 52, side surfaces and at least a portion of the bottom surface of each of the first shielding line 54, the second shielding line 56, the first intermediate line 58, and the second intermediate line 60.

Next, portions of the precursor BEOL region 36P are removed to provide the first cavity 46 and the second cavity 48 within the BEOL body 42, as depicted in FIG. 8A. Herein, the first cavity 46 is formed by removing a portion of the BEOL body 42 between the signal transmission line 50 and the first shielding line 54, removing the sticking coating 68 over the first side surface of the signal transmission line 50, removing the sticking coating 68 over the first side surface of the first shielding line 54, removing the sticking coating 68 over the first side surface of the first intermediate line 58, and removing the sticking coating 68 over the first portion of the top surface of the ground plane 52. The second cavity 48 is formed by removing another portion of the BEOL body 42 between the signal transmission line 50 and the second shielding line 56, removing the sticking coating 68 over the second side surface of the signal transmission line 50, removing the sticking coating 68 over the first side surface of the second shielding line 56, removing the sticking coating 68 over the first side surface of the second intermediate line 60, and removing the sticking coating 68 over the second portion of the top surface of the ground plane 52. Consequently, the first side surface of the signal transmission line 50 and the first side surface of the first shielding line 54, which faces the first side surface of the signal transmission line 50, are exposed to the first cavity 46. The first side surface of the first intermediate line 58 and the first portion of the top surface of the ground plane 52 are also exposed to the first cavity 46. Similarly, the second side surface of the signal transmission line 50 and the first side surface of the second shielding line 56, which faces the second side surface of the signal transmission line 50, are exposed to the second cavity 48. The first side surface of the second intermediate line 60 and the second portion of the top surface of the ground plane 52 are exposed to the second cavity 48.

In one embodiment, the removal step may be provided by a directional (anisotropic) etching process, which may be realized with a wet etchant, such as potassium hydroxide (KOH), ethylenediamine pyrocatechol (EDP), tetramethyl-ammonium hydroxide (TMAH) or the like. In addition, the removal step may be provided by a dry etching process, which may be realized with ions such as tetrafluoromethane (CH4), sulfur hexafluoride (SF6), nitrogen trifluoride (NF3), chlorine gas (Cl2), or fluorine (F2) or the like. The signal transmission line 50, the ground plane 52, the first shielding line 54, the second shielding line 56, the first intermediate line 58, and the second intermediate line 60, which are formed of metal, may withstand these wet/dry etchant chemistries. Herein, the ground plane 52 may be used as an etchant barrier to stop the etching process and isolate it from any losses coming from the substrate 30.

To ensure the removal of the sticking coating 68 over the first side surface of the signal transmission line 50 and the first side surface of the first shielding line 54, a top opening of the first cavity 46 at the top surface of the BEOL body 42 is desired to be wider than and aligned with a gap between the first side surface of the signal transmission line 50 and the first side surface of the first shielding line 54. Similarly, to ensure the removal of the sticking coating 68 over the second side surface of the signal transmission line 50 and the first side surface of the second shielding line 56, a top opening of the second cavity 48 at the top surface of the BEOL body 42 is desired to be wider than and aligned with a gap between the second side surface of the signal transmission line 50 and the first side surface of the second shielding line 56.

Furthermore, since the signal transmission line 50 may stand the wet/dry etchant chemistries, an upper cavity portion of the first cavity 46, which is above the top surface of the transmission line 50, may have a width wider than a distance between the first side surface of the signal transmission line 50 and the first side surface of the first shielding line 54. On the other hand, a lower cavity portion of the first cavity 46, which is below the top surface of the transmission line 50, may have a width essentially the same as the distance between the first side surface of the signal transmission line 50 and the first side surface of the first shielding line 54. In one embodiment, the antireflective coating 66 over a portion of the top surface of the signal transmission line 50 and over a portion of the top surface of the first shielding line 54 may also be etched away.

In addition, an upper cavity portion of the second cavity 48, which is above the top surface of the transmission line 50, may have a width wider than a distance between the second side surface of the signal transmission line 50 and the first side surface of the second shielding line 56. A lower cavity portion of the second cavity 48, which is below the top surface of the transmission line 50, may have a width essentially the same as the distance between the second side surface of the signal transmission line 50 and the first side surface of the second shielding line 58. In one embodiment, the antireflective coating 66 over another portion of the top surface of the signal transmission line 50 and over a portion of the top surface of the second shielding line 56 may also be etched away. Herein, the ground plane 52 is used to stop the etching processing. As such, both the first cavity 46 and the second cavity 48 will extend to the top surface of the ground plane 52. The antireflective coating 66 over the first and second portions of the top surface of the ground plane 52 may also be etched away.

In some applications, a timing control instead of the ground plane 52 is used to stop the etching process. As shown in FIG. 8B, with a timed etching process, the first cavity 46 may only extend beyond the first intermediate line 58 and stop above the ground plane 52, and the second cavity 48 may only extend beyond the second intermediate line 60 and stop above the ground plane 52. As such, the antireflective coating 66 over the top surface of the ground plane 52 is not etched away, and no portion of the ground plane 52 is exposed to the first cavity 46 or the second cavity 48.

In another embodiment, as illustrated in FIG. 8C, with a timed etching process, the first cavity 46 may only extend beyond the signal transmission line 50 and stop above the first intermediate line 58, and the second cavity 48 may only extend beyond the signal transmission line 50 and stop above the second intermediate line 60. As such, the antireflective coating 66 over the top surface of the ground plane 52, the sticking coating 68 over the first side surface of the first intermediate line 58, and the sticking coating 68 over the first side surface of the second intermediate line 60 are not etched away. No portion of the ground plane 52, the first intermediate line 58, or the second intermediate line 60 is exposed to the first cavity 46 or the second cavity 48.

Lastly, the encapsulation layer 44 is applied over exposed surfaces within the first cavity 46 and the second cavity 48, as illustrated in FIG. 9. The encapsulation layer 44 may also extend over the top surface of the BEOL body 42. In the first cavity 46, the encapsulation layer 44 is in contact with the first side surface of the signal transmission line 50, the first side surface of the first shielding line 54, the first side surface of the first intermediate line 58, and the first portion of the top surface of the ground plane 52. In the second cavity 48, the encapsulation layer 44 is in contact with the second side surface of the signal transmission line 50, the first side surface of the second shielding line 56, the first side surface of the second intermediate line 60, and the second portion of the top surface of the ground plane 52. Applying the encapsulation layer 44 may be provided by sputtering, implantation, thin film deposition, surface micromachining, or other post-processing steps.

In some applications, the encapsulation layer 44 may not be applied within the first cavity 46 or the second cavity 48. Instead, the first encapsulation component 70 and the second encapsulation component 72 are applied to fill the first cavity 46 and the second cavity 48, respectively, as illustrated in FIG. 10A. In the first cavity 46, the first encapsulation component 70 is in contact with the first side surface of the signal transmission line 50, the first side surface of the first shielding line 54, the first side surface of the first intermediate line 58, and the first portion of the top surface of the ground plane 52. In the second cavity 48, the second encapsulation component 72 is in contact with the second side surface of the signal transmission line 50, the first side surface of the second shielding line 56, the first side surface of the second intermediate line 60, and the second portion of the top surface of the ground plane 52. Next, the sealing layer 74 is applied over the top surface of the BEOL body 42 to seal the first encapsulation component 70 and the second encapsulation component 72, as shown in FIG. 10B.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
    a back-end-of-line (BEOL) body formed of a dielectric material and having a first cavity within the BEOL body; and
    a transmission line structure, which is embedded in the BEOL body and comprises a signal transmission line, a ground plane, a first shielding line, an antireflective coating, and a sticking coating, wherein:
        the signal transmission line and the first shielding line are formed on a same metallization level within the BEOL body, and the ground plane is formed underneath and electrically connected to the first shielding line;
        the antireflective coating covers at least a portion of a top surface of each of the signal transmission line, the ground plane, and the first shielding line;
        the sticking coating covers a bottom surface of the signal transmission line, a bottom surface and side surfaces of the ground plane, and at least a portion of a bottom surface and at least a portion of side surfaces of the first shielding line; and
    a first side surface of the signal transmission line and a first side surface of the first shielding line are exposed to the first cavity of the BEOL body and are not covered by either the antireflective coating or the sticking coating, wherein the first side surface of the signal transmission line and the first side surface of the first shielding line face each other.

2. The apparatus of claim 1 wherein the antireflective coating is formed of Titanium Nitride (TiN), and the sticking coating is formed of Tantalum Nitride (TaN).

3. The apparatus of claim 1 further comprising an encapsulation layer, wherein:
    the encapsulation layer is formed continuously within the first cavity and in contact with the first side surface of the signal transmission line and the first side surface of the first shielding line; and
    the encapsulation layer is formed of a non-conductive material.

4. The apparatus of claim 3 wherein the encapsulation layer extends over a top surface of the BEOL body.

5. The apparatus of claim 3 wherein the encapsulation layer is formed of one of a group consisting of glass, plastic, silicones, polyesters, photovoltaic (PV) materials, resins, ethyl vinyl acetate (EVA) materials, and non-EVA materials.

6. The apparatus of claim 1 further comprising an encapsulation component, wherein:
    the encapsulation component fills the first cavity, such that the encapsulation component is in contact with the first side surface of the signal transmission line and the first side surface of the first shielding line; and the encapsulation component is formed of a non-conductive material.

7. The apparatus of claim 6 further comprising a sealing layer, which is formed over a top surface of the BEOL body to seal the encapsulation component.

8. The apparatus of claim 7 wherein the encapsulation component is formed of one of a group consisting of polymers, isomers powders, and polymer powders with an additive, and the sealing layer is formed of one of a group consisting of glass, plastic, silicones, polyesters, photovoltaic (PV) materials, resins, ethyl vinyl acetate (EVA) materials, and non-EVA materials.

9. The apparatus of claim 1 further comprising a substrate, an insulator layer over the substrate, and a device layer over the insulator layer and underneath the BEOL body, wherein:
the device layer comprises a shallow trench isolation (STI) region and at least one device region; and
the transmission line structure is aligned above the STI region and not over the at least one device region.

10. The apparatus of claim 1 wherein the transmission line structure further comprises an intermediate line, wherein:
the intermediate line is formed between the ground plane and the first shielding line;
the first shielding line, the intermediate line, and the ground plane are electrically connected; and
the antireflective coating covers at least a portion of a top surface of the intermediate line, and the sticking coating covers at least a portion of a bottom surface and at least a portion of side surfaces of the intermediate line.

11. The apparatus of claim 10 wherein a first side surface of the intermediate line is exposed to the first cavity and is not covered by either the antireflective coating or the sticking coating.

12. The apparatus of claim 10 wherein the side surfaces of the intermediate line are fully covered by the sticking coating, and not exposed to the first cavity.

13. The apparatus of claim 1 wherein the transmission line structure further comprises a second shielding line, and the BEOL body further has a second cavity within the BEOL body, wherein:
the signal transmission line is formed on the same metallization level as the first shielding line and the second shielding line, and surrounded by the first shielding line and the second shielding line;
the ground plane is electrically connected to the second shielding line;
the antireflective coating covers at least a portion of a top surface of the second shielding line, and the sticking coating covers at least a portion of a bottom surface and at least a portion of side surfaces of the second shielding line; and
a second side surface of the signal transmission line and a first side surface of the second shielding line are exposed to the second cavity and are not covered by either the antireflective coating or the sticking coating, wherein the second side surface of the signal transmission line and the first side surface of the second shielding line face each other.

14. The apparatus of claim 1 wherein the transmission line structure further comprises at least one via, which extends through the sticking coating on the bottom surface of the first shielding line and is in contact with the first shielding line, and extends through the antireflective coating on the top surface of the ground plane and is in contact with the ground plane, such that the ground plane is electrically connected to the first shielding line.

15. The apparatus of claim 1 wherein the signal transmission line, the first shielding line, and the ground plane are formed of copper or aluminum.

16. The apparatus of claim 1 wherein at least a portion of the top surface of the ground plane is not covered by the antireflective coating and exposed to the first cavity at the bottom of the first cavity.

17. The apparatus of claim 1 wherein the first cavity does not extend to the ground plane, and no portion of the ground plane is exposed to the first cavity.

18. The apparatus of claim 1 wherein the first cavity comprise an upper cavity portion and a lower cavity portion, wherein:
the upper cavity portion is above the top surface of the signal transmission line, and the lower cavity portion is below the top surface of the signal transmission line;
the upper cavity portion has a width that is wider than a distance between the first side surface of the signal transmission line and the first side surface of the first shielding line; and
the lower cavity portion has a width that is essentially the same as the distance between the first side surface of the signal transmission line and the first side surface of the first shielding line.

19. A method comprising:
providing a precursor back-end-of-line (BEOL) region including a BEOL body and a transmission line structure, wherein:
the transmission line structure is embedded in the BEOL body and comprises a signal transmission line, a ground plane, a first shielding line, an antireflective coating, and a sticking coating;
the signal transmission line and the first shielding line are formed on a same metallization level within the BEOL body, and the ground plane is formed underneath and electrically connected to the first shielding line;
the antireflective coating covers a top surface of the signal transmission line, a top surface of the first shielding line, and at least a portion of a top surface of the ground plane; and
the sticking coating covers a bottom surface and side surfaces of the signal transmission line, a bottom surface and side surfaces of the ground plane, and side surfaces and at least a portion of a bottom surface of the first shielding line; and
removing a portion of the precursor BEOL region to provide a first cavity within the BEOL body, wherein:
a portion of the BEOL body between the signal transmission line and the first shielding line is removed; and
the sticking coating over a first side surface of the signal transmission line and the sticking coating over a first side surface of the first shielding line are removed, such that the first side surface of the signal transmission line and the first side surface of the first shielding line are exposed to the first cavity, wherein the first side surface of the signal transmission line and the first side surface of the first shielding line face each other.

20. The method of claim 19 further comprising applying an encapsulation layer continuously within the first cavity, such that the encapsulation layer is in contact with the first side surface of the signal transmission line and the first side surface of the first shielding line, wherein the encapsulation layer is formed of a non-conductive material.

21. The method of claim 19 further comprising:
applying an encapsulation component to fill the first cavity, such that the encapsulation component is in contact with the first side surface of the signal transmission line and the first side surface of the first shielding line, wherein the encapsulation component is formed of a non-conductive material; and
applying a sealing layer over a top surface of the BEOL body to seal the encapsulation component.

22. The method of claim 19 wherein removing the portion of the precursor BEOL region is provided by a timed etching process.

23. The method of claim 19 wherein removing the portion of the precursor BEOL region is provided by a directional etching process.

\* \* \* \* \*